United States Patent
Choi et al.

(10) Patent No.: US 9,372,379 B2
(45) Date of Patent: Jun. 21, 2016

(54) THIN FILM TRANSISTOR SUBSTRATE, METHOD FOR FABRICATING THE SAME, AND DISPLAY DEVICE INCLUDING THE SAME

(71) Applicant: Samsung Display Co., Ltd., Yongin, Gyeonggi-Do (KR)

(72) Inventors: Dan Bi Choi, Suwon-si (KR); Jung Hun Lee, Suwon-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 149 days.

(21) Appl. No.: 14/136,907

(22) Filed: Dec. 20, 2013

(65) Prior Publication Data

US 2015/0029429 A1 Jan. 29, 2015

(30) Foreign Application Priority Data

Jul. 29, 2013 (KR) ........................ 10-2013-0089559

(51) Int. Cl.
| | |
|---|---|
| *G02F 1/136* | (2006.01) |
| *G02F 1/13* | (2006.01) |
| *G02F 1/1368* | (2006.01) |
| *G02F 1/1362* | (2006.01) |
| *H01L 29/417* | (2006.01) |
| *H01L 29/66* | (2006.01) |
| *H01L 27/12* | (2006.01) |
| *H01L 27/32* | (2006.01) |
| *G02F 1/1333* | (2006.01) |

(52) U.S. Cl.
CPC ........ *G02F 1/1368* (2013.01); *G02F 1/136227* (2013.01); *H01L 27/1248* (2013.01); *H01L 27/1292* (2013.01); *H01L 29/41733* (2013.01); *H01L 29/66757* (2013.01); *H01L 29/66969* (2013.01); *G02F 2001/133357* (2013.01); *H01L 27/3248* (2013.01); *H01L 27/3262* (2013.01)

(58) Field of Classification Search
USPC .......................................................... 349/47
See application file for complete search history.

(56) References Cited

U.S. PATENT DOCUMENTS

2003/0169381 A1* 9/2003 Kawachi et al. ................ 349/43

FOREIGN PATENT DOCUMENTS

| KR | 10-2002-0062757 A | 7/2002 |
|---|---|---|
| KR | 10-2005-0072540 A | 7/2005 |
| KR | 10-2006-0025796 A | 3/2006 |
| KR | 10-2010-0066052 A | 6/2010 |
| KR | 10-2012-0001556 A | 1/2012 |
| KR | 10-2012-0041394 A | 5/2012 |

OTHER PUBLICATIONS

Kawase et al., Inkjet Printed Via-Hole Interconnections and Resistors for All-Polymer Transistor Circuits, Advanced Materials, 2001, 13, No. 21, Nov. 2, 1601-1605.

* cited by examiner

*Primary Examiner* — Wen-Ying P Chen
(74) *Attorney, Agent, or Firm* — Robert E. Bushnell, Esq.

(57) ABSTRACT

A thin film transistor substrate, a method for fabricating the same, and a display device including the same are provided. In one aspect of the present invention, there is provided a thin film transistor substrate comprising a substrate, a semiconductor layer formed on the substrate, a gate insulating film formed on the semiconductor layer, a gate electrode formed on the gate insulating film, an interlayer insulating film formed on the gate electrode and including a source contact hole and a drain contact hole for exposing portions of the semiconductor layer, and a source electrode and a drain electrode respectively inserted into the source contact hole and the drain contact hole. The interlayer insulating film includes a first convex portion formed at an inlet of the source contact hole and at an inlet of the drain contact hole.

18 Claims, 15 Drawing Sheets

THIN FILM TRANSISTOR SUBSTRATE, METHOD FOR FABRICATING THE SAME, AND DISPLAY DEVICE INCLUDING THE SAME

CLAIM OF PRIORITY

This application claims priority under 35 U.S.C. §119 to Korean Patent Application No. 10-2013-0089559, filed on Jul. 29, 2013 in the Korean Intellectual Property Office, the disclosure of which is incorporated herein in its entirety by reference.

BACKGROUND OF THE INVENTION

1. Field of the Invention

The present invention relates to a thin film transistor substrate, a method for fabricating the same, and a display device including the same, and more particularly, to a thin film transistor substrate including a convex portion formed at an inlet of a source contact hole and at an inlet of a drain contact hole, a method for fabricating the same, and a display device including the same.

2. Description of the Prior Art

A thin film transistor substrate is used as a substrate of an active matrix liquid crystal display or an active matrix organic light emitting display, which actively displays an image for respective pixels in a matrix arrangement.

A thin film transistor substrate includes a plurality of gate lines and data lines arranged lengthwise and crosswise to define a plurality of pixel regions, thin film transistors that are switching elements formed in regions where the gate lines and the data lines cross each other, and pixel electrodes formed on the pixel regions.

The thin film transistor substrate includes various structures, and the performance of the thin film transistors is determined in accordance with the sizes and locations of the structures. For example, the thin film transistor substrate includes various contact holes, and the sizes and locations of the contact holes may be important factors to determine the performance of the thin film transistor substrate.

Further, in the case of forming various structures that are included in the thin film transistor substrate, a photolithography method is generally used to laminate constituent materials and to perform patterning through a mask process. However, the photolithography method accompanies various processes, such as thin film deposition, photoresist application, mask alignment, exposure, development, etching, and stripping, and this causes the processing time and product cost to be increased.

SUMMARY OF THE INVENTION

One subject to be solved by the present invention is to provide a thin film transistor substrate, which can improve device integration and aperture ratios through forming of fine contact holes that overlap each other on a predetermined region.

Another subject to be solved by the present invention is to provide a method for fabricating a thin film transistor substrate, which can improve precision, reliability, and efficiency through forming of contact holes and electrodes using an electrohydrodynamic (EHD) ink jet process.

Still another subject to be solved by the present invention is to provide a display device, which can improve device integration and aperture ratios through forming of fine contact holes that overlap each other on a predetermined region.

Additional advantages, subjects, and features of the invention will be set forth in part in the description which follows and in part will become apparent to those having ordinary skill in the art upon examination of the following or may be learned from practice of the invention.

In one aspect of the present invention, there is provided a thin film transistor substrate comprising a substrate, a semiconductor layer located on the substrate, a gate insulating film formed on the semiconductor layer, a gate electrode formed on the gate insulating film, an interlayer insulating film formed on the gate electrode and including a source contact hole and a drain contact hole for exposing portions of the semiconductor layer, and a source electrode and a drain electrode respectively inserted into the source contact hole and the drain contact hole. The interlayer insulating film includes a first convex portion formed at an inlet of the source contact hole and at an inlet of the drain contact hole.

In another aspect of the present invention, there is provided a method for fabricating a thin film transistor, comprising forming a semiconductor layer on a substrate, forming a preliminary gate insulating film on the semiconductor layer, forming a gate electrode located on the preliminary gate insulating film, forming a preliminary interlayer insulating film on the gate electrode, respectively converting the preliminary gate insulating film and the preliminary interlayer insulating film into a gate insulating film and an interlayer insulating film by forming a source contact hole and a drain contact hole for exposing portions of the semiconductor layer through discharging of a first etching solution onto the preliminary interlayer insulating film, and respectively forming a source electrode and a drain electrode in the source contact hole and the drain contact hole.

In still another aspect of the present invention, there is provided a display device comprising a thin film transistor substrate including a substrate, a semiconductor layer located on the substrate, a gate insulating film located on the semiconductor layer, a gate electrode located on the gate insulating film, an interlayer insulating film located on the gate electrode and having a source contact hole and a drain contact hole for exposing portions of the semiconductor layer, a source electrode and a drain electrode respectively inserted into the source contact hole and the drain contact hole, a planarization layer formed on the source electrode and the drain electrode and having a pixel contact hole for exposing a portion of the drain electrode, and a pixel electrode inserted into the pixel contact hole, a common electrode facing the pixel electrode, and an organic light emitting layer or a liquid crystal layer formed between the pixel electrode and the common electrode. The interlayer insulating film and the planarization layer include convex portions formed at an inlet of the source contact hole, an inlet of the drain contact hole, and an inlet of the pixel contact hole.

According to embodiments of the present invention, at least the following effects can be achieved.

That is, since the thin film transistor includes the fine contact hole, the device integration of the thin film transistor can be improved.

Further, by making the semiconductor layer, the drain contact hole, and the pixel contact hole overlap each other, a region where the thin film transistor is located on the substrate can be decreased, and thus the region where the pixel is located can be increased.

Further, the contact inferiority between the semiconductor layer and the drain electrode and the contact inferiority between the pixel electrode and the drain electrode can be prevented.

Further, since the pixel electrode is divided into the first pixel electrode inside the pixel contact hole and a second pixel electrode outside the pixel contact hole, and appropriate materials and processes are applied to the respective locations, the process optimization can be sought.

Further, by using the electrohydrodynamic (EHD) ink jet process, various types of fine contact holes can be easily formed.

Further, several complicated processes of the existing semiconductor process can be remarkably decreased, the environmental contaminants that occur in the etching process can be prevented from being discharged, and the power loss due to the forced application of the voltage can be prevented.

Further, since the discharge of the etching solution and the discharge of the electrode solution are successively performed using a single discharge device, the process optimization can be sought.

The effects according to the present invention are not limited to the contents as exemplified above, but more various effects are described in the specification of the present invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
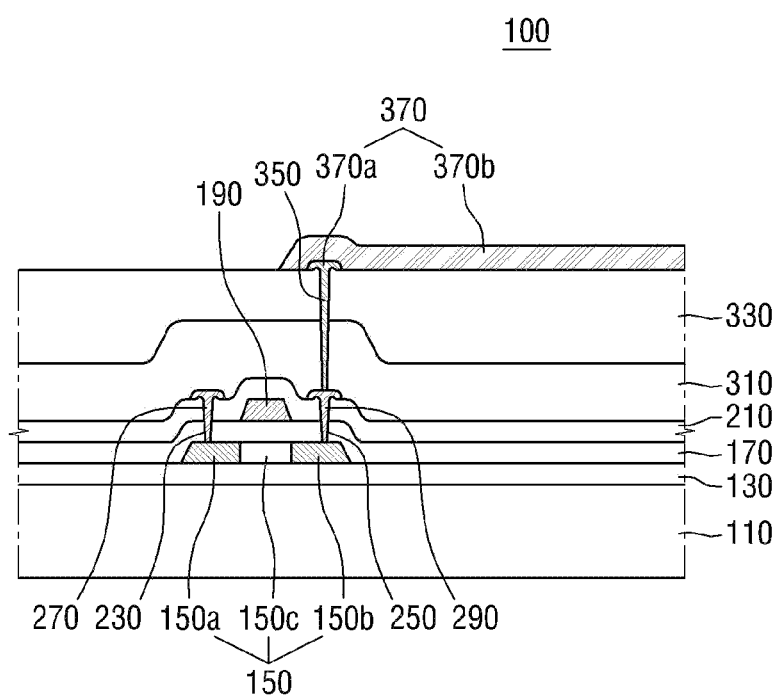
FIG. 1 is a cross-sectional view illustrating a thin film transistor substrate constructed as an embodiment according to the principles of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Hereinafter, preferred embodiments of the present invention will be described in detail with reference to the accompanying drawings.

Figure 2:
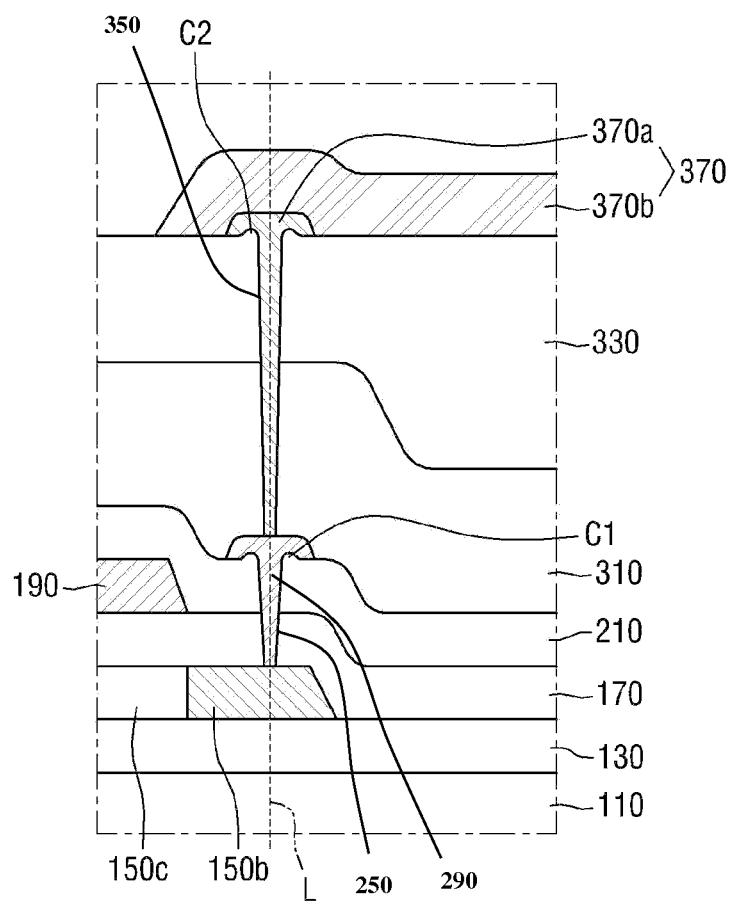
FIG. 2 is an enlarged cross-sectional view of a drain contact hole and a pixel contact hole of the thin film transistor substrate of FIG. 1.

FIG. 1 is a cross-sectional view illustrating a thin film transistor substrate 100 constructed as an embodiment according to the principles of the present invention, and FIG. 2 is an enlarged cross-sectional view of a drain contact hole 250 and a pixel contact hole 350 of the thin film transistor substrate 100 of FIG. 1. Referring to FIGS. 1 and 2, a thin film transistor substrate 100 according to an embodiment of the present invention may include a substrate 110, a buffer layer 130, a semiconductor layer 150, a gate insulating film 170, a gate electrode 190, an interlayer insulating film 210, a source electrode 270, a drain electrode 290, a protection film 310, a planarization layer 330, and a pixel electrode 370.

In the description, the thin film transistor substrate 100 may mean a substrate that includes thin film transistors.

The substrate 110 may include a transparent insulating film. For example, the substrate 110 may be a glass substrate, a quartz substrate, or a transparent resin substrate. The transparent resin substrate that can be used as the substrate 110 may include polyimide resin, acrylic resin, polyacrylate resin, polycarbonate resin, polyether resin, polyethyleneterepthalate resin, or sulfonic acid resin.

The buffer layer 130 may be formed on one surface of the substrate 110. The buffer layer 130 may function to prevent metal atoms and impurities from being diffused from the substrate 110. Further, the buffer layer 130 may also serve to improve the flatness of the surface of the substrate 110 if the surface of the substrate 110 is not uniform. The buffer layer 130 may be made of silicon compounds. For example, the buffer layer 130 may include silicon oxide, silicon nitride, silicon oxynitride, silicon oxycarbide, or silicon carbonitride. They may be used independently or in combination. In other exemplary embodiments, the buffer layer 130 may have a single-layer structure or a multilayer structure including silicon compounds. For example, the buffer layer 130 may include silicon oxide, silicon nitride, silicon oxynitride, silicon oxycarbide, and/or silicon carbonitride. Alternatively, the buffer layer 130 may be omitted depending on the surface flatness or constituent materials of the substrate 110.

The semiconductor layer 150 may be formed on the buffer layer 130. The semiconductor layer 150 may be made of an amorphous semiconductor, fine crystalline semiconductor, or polycrystalline semiconductor, and preferably may be made of polycrystalline semiconductor. Further, the semiconductor layer 150 may be made of oxide semiconductor. Further, the semiconductor layer 150 includes a channel portion 150c in which no impurity is doped, and a source portion 150a and a drain portion 150b formed at opposite ends of the channel portion 150c and doped with p+. In this case, a doped ion material may be a P-type impurity, such as boron (B), and for example, $B_2H_6$ may be used. Here, the impurity may differ depending on the kind of thin film transistor.

The gate insulating film 170 may be formed on the buffer layer 130 to cover the semiconductor layer 150. The gate insulating film 170 may be made of silicon oxide (SiOx), silicon nitride (SiNx), or metal oxide. The metal oxide that can be used as the gate insulating film 170 may include hafnium oxide (HfOx), aluminum oxide (AlOx), zirconium oxide (ZrOx), titanium oxide (TiOx), and tantalum oxide (TaOx). They may be used independently or in combination. For example, the gate insulating film 170 may be uniformly formed on the buffer layer 130 along a profile of the semiconductor layer 150. The gate insulating film 170 may have a relatively thin thickness, and a step portion that is adjacent to the semiconductor layer 150 may be formed on the gate insulating film 170. In other exemplary embodiments, the gate insulating film 170 may have a substantially flat upper surface as sufficiently covering the semiconductor layer 150. In this case, the gate insulating film 170 may have a relatively thick thickness.

The gate electrode 190 may be formed on the gate insulating film 170. The gate electrode 190 may be formed on a portion of the gate insulating film 170, which the semiconductor layer 150 is located below. The gate electrode 190 may include metal, an alloy, metal nitride, conductive metal oxide, or a transparent conductive material. For example, the gate electrode 190 may include aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), chrome (Cr), chrome nitride (CrOx), molybdenum (Mo), an alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), or indium zinc oxide (IZO). They may be used independently or in combination. In exemplary embodiments, the gate electrode 190 may have a width that is substantially smaller than the width of the semiconductor layer 150. For example, the gate electrode 90 may have the width that is substantially the same as or substantially similar to the width of the channel portion 150c. Further, the gate electrode 190 and the channel portion 150c may overlap each other. However, the dimensions of the gate electrode 190 and/or the dimensions of the channel portion 150c may be changed depending on the electric characteristics required in the switching element.

The interlayer insulating film 210 may be formed on the gate insulating film 170 to cover the gate electrode 190. The interlayer insulating film 210 may be formed on the gate insulating film 170 along the profile of the gate electrode 190 with a substantially uniform thickness. Accordingly, a step portion that is adjacent to the gate electrode 190 may be formed on the interlayer insulating film 210. The interlayer insulating film 210 may be made of silicon compound. For example, the interlayer insulating film 210 may include silicon oxide, silicon nitride, silicon oxynitride, silicon oxycarbide, or silicon carbonitride. They may be used independently or in combination. Further, the interlayer insulating film 210 may have a single-layer structure or a multilayer structure including silicon oxide, silicon nitride, silicon oxynitride, silicon oxycarbide, or silicon carbonitride. Further, the interlayer insulating film 210 may be made of a material that is substantially the same as the material of the gate insulating film 170 as described above. The interlayer insulating film 210 may serve to insulate the gate electrode 190 from the source electrode 270 and the drain electrode 290 to be subsequently formed.

The interlayer insulating film 210 may include a source contact hole 230 and a drain contact hole 250 for exposing portions of the semiconductor layer 150. In an exemplary embodiment, the source contact hole 230 formed in the interlayer insulating film 210 may expose the source portion 150a of the semiconductor layer 150, and the drain contact hole 250 formed in the interlayer insulating film 210 may expose the drain portion 150b of the semiconductor layer 150. In an exemplary embodiment illustrated in FIG. 1, if the gate insulating film 170 is located on the source portion 150a and the drain portion 150b of the semiconductor layer 150, the source contact hole 230 and the drain contact hole 250 may be formed to penetrate the gate insulating film 170. The source contact hole 230 and the drain contact hole 250 may be arranged in parallel to each other. Further, the source contact hole 230 and the drain contact hole 250 may be formed to be symmetric to each other about the gate electrode 190. Although not illustrated in the drawing, the source contact hole 230 and the drain contact hole 250 may be in a circular shape on the plan view, but are not limited thereto. The source contact hole 230 and the drain contact hole 250 may have various shapes. Further, the source contact hole 230 and the drain contact hole 250 may have a diameter that is smaller than 5 μm. Specifically, the diameter of the source contact hole 230 and the drain contact hole 250 may be about 0.01 μm to about 1 μm.

The source contact hole 230 and the drain contact hole 250 may be formed in various methods. In an exemplary embodiment, the source contact hole 230 and the drain contact hole 250 may be formed in an electrohydrodynamic (EHD) ink jet process. The detailed process of forming the source contact hole 230 and the drain contact hole 250 in the electrohydrodynamic ink jet process will be described later. In another exemplary embodiment, the source contact hole 230 and the drain contact hole 250 may be formed through processing of the interlayer insulating film 210 using laser.

As shown in FIG. 2, the interlayer insulating film 210 may include a first convex portion C1 formed at an inlet of the source contact hole 230 and at an inlet of the drain contact hole 250. Specifically, the surface of the interlayer insulating film 210 may be formed along the profile of the structures that are laminated on the lower portion of the interlayer insulating film 210, that is, the gate electrode 190 and the gate insulating film 210, and may project convexly at the inlet of the source contact hole 230 and the inlet of the drain contact hole 250. Here, the convexly projecting direction may be a direction in which the protection film 310 to be described later or the planarization layer 330 is formed. Although not illustrated in the drawing, the first convex portion C1 may be in a ring shape on the plan view, but is not limited thereto. The convex portion may have a shape that corresponds to the shape of the inlet of the source contact hole 230 and the inlet of the drain contact hole 250.

The source electrode 270 and the drain electrode 290 may be formed on the interlayer insulating film 210. Specifically, the source electrode 270 and the drain electrode 290 may be respectively inserted into the source contact hole 230 and the drain contact hole 250. The source electrode 270 and the drain electrode 290 may be arranged to be spaced apart from each other for a predetermined distance centering around the gate electrode 190 to be adjacent to the gate electrode 190. For example, the source electrode 270 and the drain electrode 290 may penetrate the interlayer insulating film 210 and the gate insulating film 170 and come in contact with the source portion 150a and the drain portion 150b of the semiconductor layer 150, respectively. The source electrode 270 and the drain electrode 290 may include metal, an alloy, metal nitride, conductive metal oxide, or a transparent conductive material. For example, the source electrode 270 and the drain electrode 290 may include aluminum, an alloy containing aluminum, aluminum nitride, silver, an alloy containing silver, tungsten, tungsten nitride, copper, an alloy containing copper, nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide. They may be used independently or in combination. On the other hand, the source electrode 270 and the drain electrode 290 may have a single-layer structure or a multilayer structure including metal, an alloy, metal nitride, conductive metal oxide, or a transparent conductive material. As the source electrode 270 and the drain electrode 290 are formed on the substrate 110, a thin film transistor, which includes the semiconductor layer 150, the gate insulating film 170, the gate electrode 190, the source electrode 270, and the drain electrode 290, may be provided on the substrate 110 as a switching element of the display device.

The source electrode 270 and the drain electrode 290 may be formed in various methods. In an exemplary embodiment, the source electrode 270 and the drain electrode 290 may be formed in the electrohydrodynamic (EHD) ink jet process. The detailed process of forming the source electrode 270 and the drain electrode 290 in the electrohydrodynamic ink jet process will be described later.

The protection film 310 may be formed on the source electrode 270 and the drain electrode 290. That is, the protection film 310 may be formed on the interlayer insulating film 210 to cover the source electrode 270 and the drain electrode 290. The protection film 310 may have a thickness enough to completely cover the source electrode 270 and the drain electrode 290. The protection film 310 may be formed using an organic material or an inorganic material. For example, the protection film 310 may include photoresist, acryl-based polymer, polyimide-based polymer, polyamide-based polymer, siloxane-based polymer, polymer including a photosensitive acrylic carboxyl group, novolac resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, or titanium oxide. They may be used independently or in combination. In other exemplary embodiments, the protection film 310 that covers the thin film transistor may not be provided depending on the constituent materials or the dimensions of the planarization film 330 to be subsequently formed.

The planarization layer 330 may be formed on the protection film 310. The planarization layer 330 may have a flat surface. That is, the planarization layer 330 may be formed with a sufficient thickness, and thus one surface on which the pixel is located may be flat. The planarization layer 330 may be made of an insulating material. Further, the planarization layer 330 may be made of an organic material, for example, polyimide. Further, the planarization layer 330 may be formed in a single-layer structure or in a multiplayer structure that includes at least two insulating films.

The planarization layer 330 may include a pixel contact hole 350 for exposing a portion of the drain electrode 290. In an exemplary embodiment, the pixel contact hole 350 may expose the center portion of the drain electrode 290. The pixel contact hole 350 may be formed to extend from the one surface of the substrate 110 in the vertical direction. Further, the pixel contact hole 350 may be formed on the drain contact hole 250. Further, the pixel contact hole 350 may overlap the drain contact hole 250. Further, the pixel contact hole 350 and the drain contact hole 250 may overlap each other. Further, the pixel contact hole 350 and the drain contact hole 250 may overlap the drain portion 150b of the semiconductor layer 150. Referring to FIG. 2, the pixel contact hole 350, the drain contact hole 250, and the drain portion 150c of the semiconductor layer 150 may be formed on a same line L. Here, the same line L may be a line that is perpendicular to the one surface of the substrate 110. Although not illustrated in the drawing, the pixel contact hole 350 may be in the circular shape on the plan view. However, the shape of the pixel contact hole 350 is not limited thereto, but the pixel contact hole 350 may have various shapes. Further, the shape of the pixel contact hole 350 may be substantially the same as the shape of the soured contact hole 230 and the drain contact hole 250. Further, the diameter of the pixel contact hole 350 may be smaller than 5 μm. Specifically, the diameter of the pixel contact hole 350 may be 0.01 to 1 μm. Further, the diameter of the pixel contact hole 350 maybe substantially the same as the diameter of the source contact hole 230 and the drain contact hole 250.

The pixel contact hole 350 may be formed in various methods. In an exemplary embodiment, the pixel contact hole 350, in the same manner as the source contact hole 230 and the drain contact hole 250 as described above, may be formed in the electrohydrodynamic (EHD) ink jet process. The detailed process of forming the pixel contact hole 350 in the electrohydrodynamic ink jet process will be described later. In another exemplary embodiment, the pixel contact hole 350 may be formed through processing of the planarization layer 330 using laser.

The planarization layer 330 may include a second convex portion C2 formed at an inlet of the pixel contact hole 350. Specifically, the surface of the planarization layer 330 may be formed along the profile of the structures that are laminated on the lower portion of the planarization layer 330, for example, along the profile of the protection film 310, and may project convexly at the inlet of the pixel contact hole 350. Here, the convexly projecting direction may be the same as the direction in which the first convex portion C1 projects. Although not illustrated in the drawing, the second convex portion C2 may be in a ring shape on the plan view, but is not limited thereto. The second convex portion C2 may have a shape that corresponds to the shape of the inlet of the pixel contact hole C2. Further the shape of the second convex portion C2 may be substantially the same as the shape of the first convex portion C1.

The pixel electrode 370 may be formed on the planarization layer 330. Specifically, the pixel electrode 370 may be inserted into the pixel contact hole 350. The pixel electrode 370 may penetrate the planarization layer 330 and come in contact with the drain electrode 290. The pixel electrode 370 may include metal, an alloy, metal nitride, conductive metal oxide, or a transparent conductive material. For example, the pixel electrode 370 may include aluminum, an alloy containing aluminum, aluminum nitride, silver, an alloy containing silver, tungsten, tungsten nitride, copper, an alloy containing copper, nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide. They may be used independently or in combination. Further, the pixel electrode 370 may be made of the same material as the material of the source electrode and/or drain electrode 290. On the other hand, the pixel electrode 370 may have a single-layer structure or a multilayer structure including metal, an alloy, metal nitride, conductive metal oxide, or a transparent conductive material.

The pixel electrode 370 may include a first pixel electrode 370a and a second pixel electrode 370b.

The first pixel electrode 370a may be located inside the pixel contact hole 350. The first pixel electrode 370a may fill the pixel contact hole 350. As illustrated in FIGS. 1 and 2, a portion of the first pixel electrode 370a may project above the pixel contact hole 350, but is not limited thereto. The first pixel electrode 370a may be completely included inside the pixel contact hole 350. Further, the first pixel electrode 370a may cover the second convex portion C2, but is not limited thereto. The first pixel electrode 370a may not cover the second convex portion C2. Further, the first pixel electrode 370a may be in a "T" shape on the cross-sectional view, but is not limited thereto. The first pixel electrode 370a may be in a "1" shape. On end portion of the first pixel electrode 370a may come in contact with the upper portion of the drain electrode 290, and the other end portion of the first pixel electrode 370a that faces the one end portion may come in contact with the lower portion of the second pixel electrode 370b.

The first pixel electrode 370a may be formed in various methods. In an exemplary embodiment, the first pixel electrode 370a may be formed in the electrohydrodynamic (EHD) ink jet process. The detailed process of forming the first pixel electrode 370a in the electrohydrodynamic ink jet process will be described later.

The second pixel electrode 370b may be located on the pixel contact hole 350. The second pixel electrode 370b may cover the inlet of the pixel contact hole 350. Further, the second pixel electrode 370b may be formed to cover a region where the pixel is located in the display device. The surface of the second pixel electrode 370b may be substantially flat except for the upper portion of the pixel contact hole 350.

The second pixel electrode 370b may be formed in various methods. In an exemplary embodiment, the second pixel electrode 370b may be formed through a general deposition process, for example, a sputtering process, using photoresist and a mask. In another exemplary embodiment, the second pixel electrode 370b may be formed in the electrohydrodynamic ink jet process.

The composition and/or properties of the first pixel electrode 370a and the second pixel electrode 370b may differ from each other. In an exemplary embodiment, the first pixel electrode 370a and the second pixel electrode 370b may be made of different materials. For example, the main materials, for example, metal materials, included in the first pixel electrode 370a and the second pixel electrode 370b may be the same, but sub-materials, for example, organic materials, included in the first pixel electrode 370a and the second pixel electrode 370b may be different from each other. Specifically, the first pixel electrode 370a may include a small mount of organic material, but the second pixel electrode 370b may not include the organic material. In another exemplary embodiment, the porosity rate of the first pixel electrode 370a may be higher than the porosity rate of the second pixel electrode 370b. That is, the first pixel electrode 370a may include stomata that are more than the stomata of the second pixel electrode 370b. Further, in another exemplary embodiment, the adhesive force of the first pixel electrode 370a may be weaker than the adhesive force of the second pixel electrode 370b. Specifically, the adhesive force between the first pixel electrode 370a and the planarization layer 330 may be weaker than the adhesive force between the second pixel electrode 370b and the planarization layer 330. Further, in still another exemplary embodiment, the first pixel electrode 370a and the second pixel electrode 370b may be formed in different processes. For example, the first pixel electrode 370a may be formed in the electrohydrodynamic ink jet process, and the second pixel electrode 370b may be formed in a general deposition process.

As described above, according to the thin film transistor substrate 100 according to an embodiment of the present invention, the thin film transistor can include the fine contact holes 230, 250, and 350, and thus the device integration of the thin film transistor substrate 100 can be improved. Further, since the semiconductor layer 150, the drain contact hole 250, and the pixel contact hole 350 overlap each other, the region where the thin film transistor is located on the substrate 110 can be decreased, and thus the region where the pixel is located can be increased. That is, if the display device is fabricated using the thin film transistor substrate 100 according to an embodiment of the present invention, the aperture ratio of the display device can be improved. Further, the contact inferiority between the semiconductor layer 150 and the drain electrode 290 and the contact inferiority between the pixel electrode 370 and the drain electrode 290 can be prevented. Further, since the pixel electrode 370 is divided into the first pixel electrode 370a that is inside the pixel contact hole 350 and the second pixel electrode 370b that is outside the pixel contact hole 350 and materials and processes that are appropriate to the respective locations are applied, process optimization can be sought.

Figure 3:
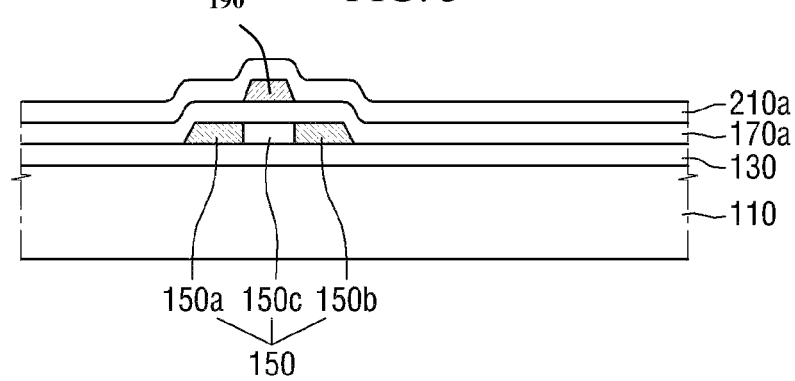
FIG. 3 is a cross-sectional view illustrating preparing of a laminated body of a substrate, a buffer layer, a semiconductor layer, a preliminary gate insulating film, a gate electrode, and a preliminary interlayer insulating film in a method for fabricating the thin film transistor substrate of FIG. 1.
Figure 4:
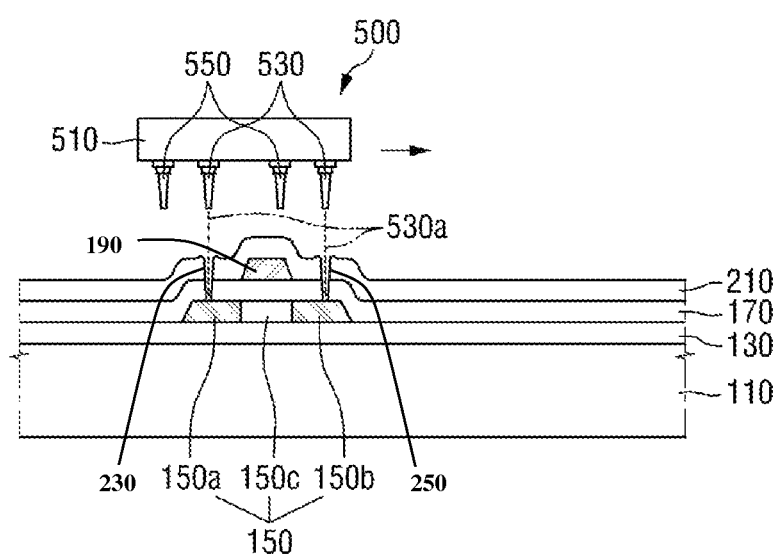
FIG. 4 is a cross-sectional view illustrating forming of a source contact hole and a drain contact hole in a method for fabricating the thin film transistor substrate of FIG. 1.
Figure 5:
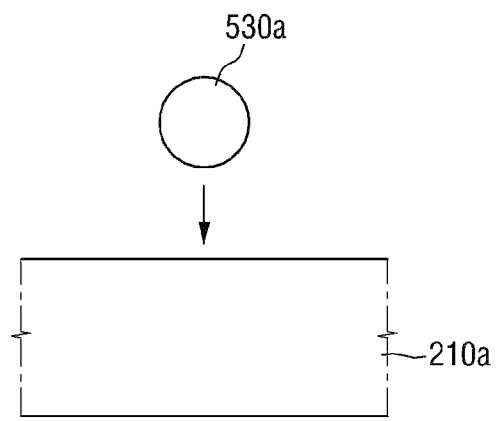
FIGS. 5 to 7 are cross-sectional views illustrating forming of the source contact hole and the drain contact hole of FIG. 4.
Figure 6:
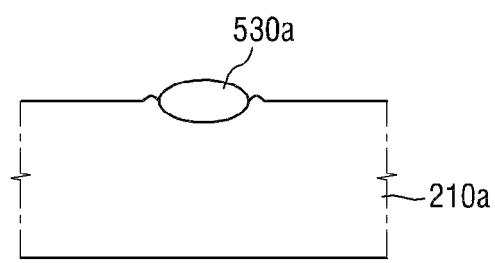
Figure 7:
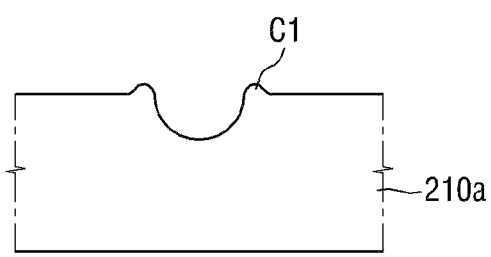
Figure 8:
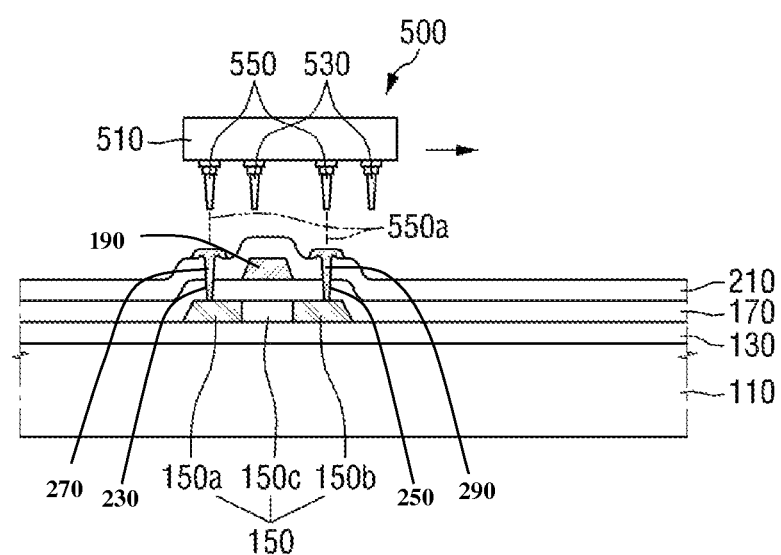
FIG. 8 is a cross-sectional view illustrating forming of a source electrode and a drain electrode in a method for fabricating the thin film transistor substrate of FIG. 1.
Figure 9:
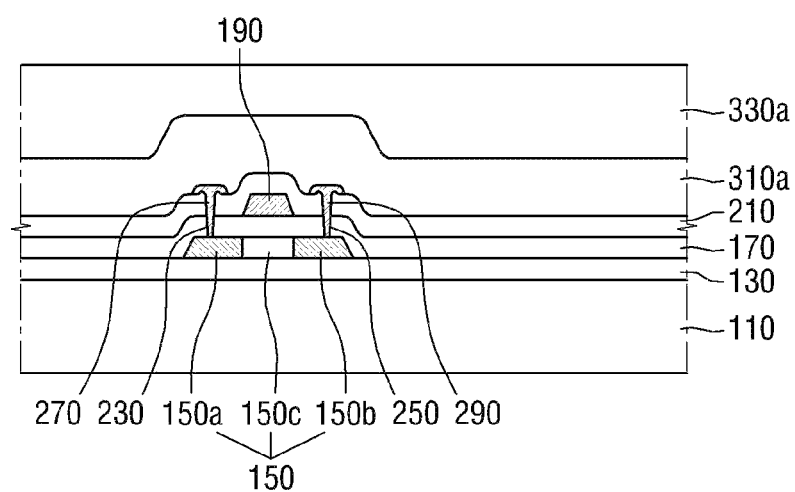
FIG. 9 is a cross-sectional view illustrating forming of a preliminary protection film and a preliminary planarization layer in a method for fabricating the thin film transistor substrate of FIG. 1.
Figure 10:
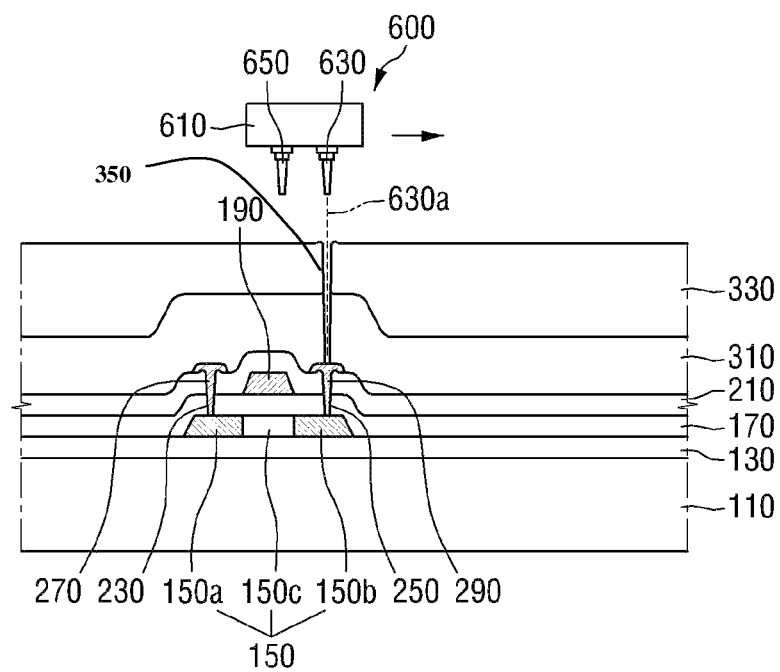
FIG. 10 is a cross-sectional view illustrating forming of a pixel contact hole in a method for fabricating the thin film transistor substrate of FIG. 1.
Figure 11:
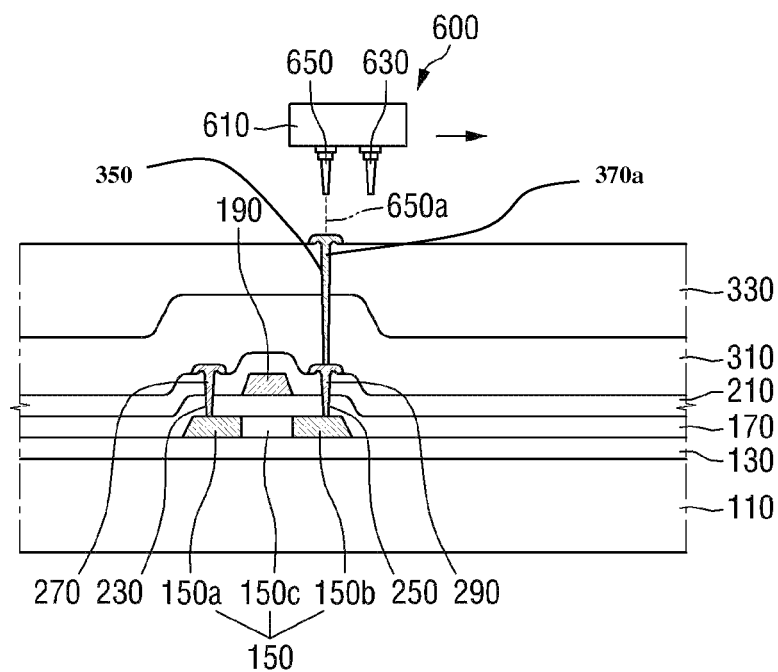
FIG. 11 is a cross-sectional view illustrating forming of a first pixel electrode in a method for fabricating the thin film transistor substrate of FIG. 1.
Figure 12:
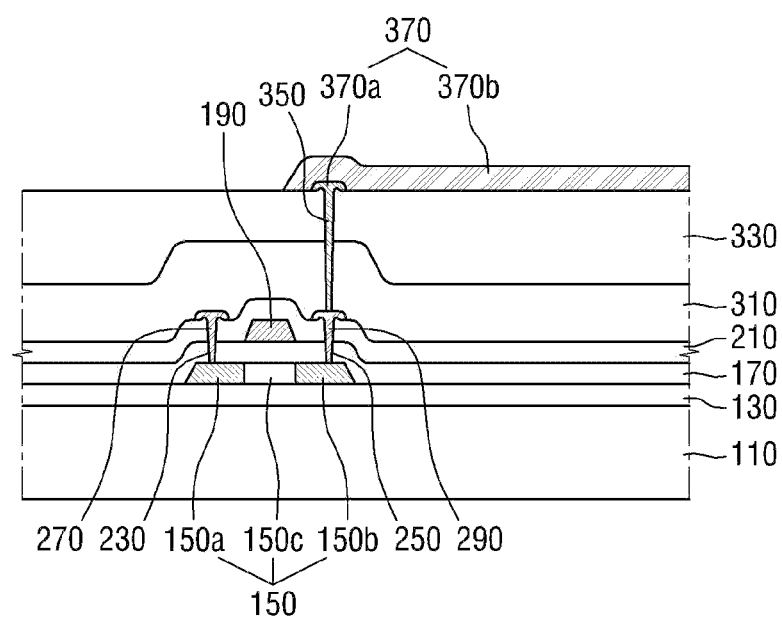
FIG. 12 is a cross-sectional view illustrating forming of a second pixel electrode in a method for fabricating the thin film transistor substrate of FIG. 1.

Hereinafter, a method for fabricating a thin film transistor substrate 100 according to an embodiment of the present invention will be described with reference to FIGS. 3 to 12. FIG. 3 is a cross-sectional view explaining preparing of a laminated body of a substrate 110, a buffer layer 130, a semiconductor layer 150, a preliminary gate insulating film 170a, a gate electrode 190, and a preliminary interlayer insulating film 210a in a method for fabricating the thin film transistor substrate 100 of FIG. 1. FIG. 4 is a cross-sectional view explaining forming of a source contact hole 230 and a drain contact hole 250 in a method for fabricating the thin film transistor substrate 100 of FIG. 1. FIGS. 5 to 7 are cross-sectional views explaining forming of the source contact hole 230 and the drain contact hole 250 of FIG. 4. FIG. 8 is a cross-sectional view illustrating forming of a source electrode 230 and a drain electrode 290 in a method for fabricating the thin film transistor substrate 100 of FIG. 1. FIG. 9 is a cross-sectional view illustrating forming of a preliminary protection film 310a and a preliminary planarization layer 330a in a method for fabricating the thin film transistor substrate 100 of FIG. 1. FIG. 10 is a cross-sectional view illustrating forming of a pixel contact hole 350 in a method for fabricating the thin film transistor substrate 100 of FIG. 1. FIG. 11 is a cross-sectional view illustrating forming of a first pixel electrode 370a in a method for fabricating the thin film transistor substrate 100 of FIG. 1, and FIG. 12 is a cross-sectional view illustrating forming of a second pixel electrode 370b in a method for fabricating the thin film transistor substrate 100 of FIG. 1. For convenience in explanation, the same reference numerals are used for elements that are substantially the same as the elements illustrated in FIGS. 1 and 2, and the duplicate description thereof will be omitted.

First, referring to FIG. 3, the laminated body may be prepared, in which the substrate 110, the buffer layer 130, the semiconductor layer 150, the preliminary gate insulating film 170a, the gate electrode 190, and the preliminary interlayer insulating film 210a are sequentially laminated. Here, the preliminary gate insulating film 170a may be a gate insulating film before the source contact hole 230 and the drain contact hole 250 are formed. Further, the preliminary interlayer insulating film 210a may be an interlayer insulating film before the source contact hole 230 and the drain contact hole 250 are formed. The buffer layer 130, the semiconductor layer 150, the preliminary gate insulating film 170a, the gate electrode 190, and the preliminary interlayer insulating film 210a, which are laminated on the substrate 110, may be formed through a general deposition process.

Next, referring to FIG. 4, after the laminated body is prepared, a first discharge device 500 may be located on the laminated body. Here, the first discharge device 500 may be an electrohydrodynamic ink jet printer using an electrohydrodynamic ink jet process.

The electrohydrodynamic ink jet process is a process which gives charge through applying of high voltage to a solution, applies a voltage to the solution having the charge, and discharges the solution. In the electrohydrodynamic ink jet process, various discharge types, for example, fine conical liquid head mode and the like, may be obtained through control of the voltage. That is, the electrohydrodynamic ink jet process is a process that can form a fine pattern at a desired location.

The first discharge device 500 may include a first body 510, a first etching solution discharge nozzle 530, and a first electrode solution discharge nozzle 550.

The first body 510 may support the first etching solution discharge nozzle 530 and the first electrode solution discharge nozzle 550, and supply a first etching solution 530a and a first electrode solution 550a to the first etching solution discharge nozzle 530 and the first electrode solution discharge nozzle 550, respectively. Further, the first body 510 may move the first etching solution discharge nozzle 530 and the first electrode solution discharge nozzle 550 in one direction that is parallel to the substrate 110. FIG. 4 illustrates that the first body 510 moves in one direction, but is not limited thereto. A support (not illustrated) that supports the substrate 110 may move in one direction.

The first etching solution discharge nozzle 530 may discharge the first etching solution 530a in the electrohydrodynamic ink jet method. Here, the first etching solution 530a may be a buffered oxide etch (BOE) solution with 10% dilute hydrofluoric acid (HF), but is not limited thereto. The first etching solution 530a may be one of various known etching solutions.

The first electrode solution discharge nozzle 550 may discharge the first electrode solution 550a in the electrohydrodynamic ink jet method. Here, the first electrode solution 550a may be a solution in which an organic material is attached to the surface of metal particles, such as silver, gold, or copper. That is, the first electrode solution 550a may be a solution in which a general electrode material is dispersed into an organic solvent.

Although not illustrated in the drawing, the first discharge device 500 may further include an external electrode that is installed spaced apart from the first etching solution discharge nozzle 530 and the first electrode solution discharge nozzle 550. Further, the first discharge device 500 may further include a power supply that applies a voltage to the first etching solution discharge nozzle 530, the first electrode solution discharge nozzle 550, and the external electrode. As the power supply applies the voltage to the first etching solution discharge nozzle 530, the first electrode solution discharge nozzle 550, and the external electrode, the discharge type and the discharge amount of the first etching solution 530a and the first electrode solution 550a can be adjusted.

The first etching solution discharge nozzle 530 of the first discharge device 500 as described above may be located on the source portion 150a and the drain portion 150b of the semiconductor layer 150, and then the first etching solution 530a may be discharged in the electrohydrodynamic ink jet method. The first etching solution 530a may be discharged onto the preliminary interlayer insulating film 210a in the form of liquid droplets. The discharged first etching solution 530a may etch the preliminary interlayer insulating film 210a and the preliminary gate insulating film 170a to form the source contact hole 230 and the drain contact hole 250.

Referring to FIGS. 5 to 7, a process of forming the source contact hole 230 and the drain contact hole 250 will be described in detail. First, referring to FIG. 5, the first etching solution 530a in the form of liquid droplets that is discharged from the first etching solution discharge nozzle 530 may drop on the preliminary interlayer insulating film 210a. Next, referring to FIG. 6, if the first etching solution 530a in the form of liquid droplets meets the surface of the preliminary interlayer insulating film 210a, the shape of the first etching solution 530a is widened to etch the preliminary interlayer insulating film 210a. Next, referring to FIG. 7, a center portion where the discharged first etching solution 530a and the preliminary interlayer insulating film 210a meet each other is etched to be concave. Further, on an edge portion where the discharged first etching solution 530a and the preliminary interlayer insulating film 210a meet each other, a constituent material of the preliminary interlayer insulating film 210a, which is resolved in the first etching solution 530a, is conveyed by microfluidic flow and is accumulated.

Through repetition of the processes of FIGS. 5 to 7 as described above, the source portion 150a and the drain portion 150b of the semiconductor layer 150 are exposed to form the source contact hole 230 and the drain contact hole 250, and the preliminary interlayer insulating film 210a and the preliminary gate insulating film 170a are respectively converted into the interlayer insulating film 210 and the gate insulating film 170. Further, the first convex portion C1 may be formed at the inlet of the source contact hole 230 and at the inlet of the drain contact hole 250.

Although not illustrated in the drawing, after the source contact hole 230 and the drain contact hole 250 are formed, the interlayer insulating film 210 may be cleaned. By cleaning the interlayer insulating film 210, the first etching solution 530a that remains in the source contact hole 230 and the drain contact hole 250 may be cleaned and particles may be removed. Here, the interlayer insulating film 210 may be cleaned using deionized water (D1 water). Further, in the case of removing the first etching solution 530a that remains in the source contact hole 230 and the drain contact hole 250, a suction nozzle may be used. In an exemplary embodiment, the suction nozzle may be installed in the first discharge device 500 as described above.

Next, referring to FIG. 8, after the source contact hole 230 and the drain contact hole 250 are formed, the first electrode solution 550a may be discharged to the inside of the source contact hole 230 and the drain contact hole 250. Specifically, after the first electrode solution discharge nozzle 550 of the first discharge device 500 as described above is located on the source contact hole 230 and the drain contact hole 250, the first electrode solution 550a may be discharged in the electrohydrodynamic ink jet method. The first electrode solution 550a in the form of liquid droplets may be discharged to the inside of the source contact hole 230 and the drain contact hole 250.

After the first electrode solution 550a sufficiently fills the source contact hole 230 and the drain contact hole 250, the first electrode solution 550a may be sintered. By sintering the first electrode solution 550a, the organic material in the first electrode solution 550a is evaporated to form the source electrode 270 and the drain electrode 290. The sintering of the first electrode solution 550a may be performed in a low-temperature process of 200 to 400° C.

Next, referring to FIG. 9, after the source electrode 270 and the drain electrode 290 are formed, the preliminary protection film 310a and the preliminary planarization layer 330a may be formed on the source electrode 270 and the drain electrode 290. The preliminary protection film 310a and the preliminary planarization layer 330a may be formed through a general deposition process.

Next, referring to FIG. 10, after the preliminary protection film 310a and the preliminary planarization layer 330a are formed, a second discharge device 600 may be located on the preliminary planarization layer 330a. Here, the second discharge device 600 is an electrohydrodynamic ink jet printer using the electrohydrodynamic ink jet process, and may have substantially the same configuration as the configuration of the first discharge device 500.

The second discharge device 600 may include a second body 610, a second etching solution discharge nozzle 630 that discharges the second etching solution 630a, and a second electrode solution discharge nozzle 650 that discharges the second electrode solution 650a. The respective constituent elements of the second discharge device 600 may be substantially the same as the constituent elements of the first discharge device 500. Here, the second etching solution 630a may be NMP (NMethyl-pyrrolidone) or PGMEA (Propylene Glycol Mnomethyl Ether Acetate), but is not limited thereto. The second etching solution 630a may be one of various known etching solutions, and may be the same as the first etching solution 530a. Further, the second electrode solution 650a may be a solution in which a general electrode material is dispersed into an organic solvent, and may be the same as the first electrode solution 550a.

The second etching solution discharge nozzle 630 of the second discharge device 600 as described above may be located on the drain electrode 290, and then the second etching solution 630a may be discharged in the electrohydrodynamic ink jet method. The second etching solution 630a may be discharged onto the preliminary interlayer insulating film 210a in the form of liquid droplets. The discharged second etching solution 630a may etch the preliminary planarization layer 330a and the preliminary protection film 310a to form the pixel contact hole 350. As described above, since the drain electrode 290 is exposed and the pixel contact hole 350 is formed, the preliminary planarization layer 330a and the preliminary protection film 310a may be respectively converted into the planarization layer 330 and the protection film 310. Further, the second convex portion C2 may be formed at the inlet of the pixel contact hole 350.

Although not illustrated in the drawing, after the pixel contact hole 350 is formed, the planarization layer 330 may be cleaned. By cleaning the planarization layer 330, the second etching solution 630a that remains in the pixel contact hole 350 may be cleaned and the particles may be removed.

Next, referring to FIG. 11, after the pixel contact hole 350 is formed, the second electrode solution 650a may be discharged to the inside of the pixel contact hole 350. Further, after the second electrode solution 650a sufficiently fills the pixel contact hole 350, the second electrode solution 650a may be sintered. By sintering the second electrode solution 650a, the organic material in the second electrode solution 650a is evaporated to form the first pixel electrode 370a.

Next, referring to FIG. 12, after the first pixel electrode 370a is formed, the second pixel electrode 370b may be formed. The second pixel electrode 370b may be formed through depositing of an electrode material on the pixel contact hole 350. That is, the second pixel electrode 370b may be formed through a general deposition process. As described above, by forming the first pixel electrode 370a in the electrohydrodynamic ink jet process and forming the second pixel electrode 370b in the general deposition process, the composition and/or properties of the first pixel electrode 370a and the second pixel electrode 370b may differ from each other.

As described above, according to the method for fabricating a thin film transistor substrate 100 according to an embodiment of the present invention, the diameter of the contact holes 230, 250, and 350 that are formed in the electrohydrodynamic ink jet process is about 0.01 μm to 1 μm, and thus it may be difficult to fill the contact holes with the electrode material. However, the contact holes 230, 250, and 350 may be filled with the electrode material through the electrohydrodynamic ink jet process. Further, in the case of forming the electrode, for example, the second pixel electrode 370b in a wide range, the general deposition process is used, and thus the process efficiency can be sought.

Further, according to the method for fabricating a thin film transistor substrate 100 according to an embodiment of the present invention, the electrohydrodynamic ink jet process is used, and thus several complicated processes of the existing semiconductor process can be considerably reduced. Further, since the environmental contaminants that occur in the etching process can be prevented from being discharged and the same injection flow rate can be realized even with a low applied voltage, the power loss due to the forced application of the voltage can be prevented. Further, by adjusting the voltage or potential difference, the injection type of the etching solution and/or the electrode solution can be adjusted, and thus various types of contact holes can be easily formed. Further, the contact holes can be precisely provided below a micro-unit. Accordingly, the precision, reliability, and efficiency of the patterning process can be improved. Further, the manufacturing cost can be reduced through the process simplification. Further, since the etching solutions 530a and 630a or the electrode solutions 550a and 650a of a nozzle size of 1/20 can be discharged, the limit of the nozzle size can be mitigated. Further, since the etching solutions 530a and 630a or the electrode solutions 550a and 650a are less influenced by their kinds and viscosity characteristics, the etching solutions 530a and 630a or the electrode solutions 550a and 650a having the viscosity of 10 to 10000 CP (Centipoise) can be used, and it is possible to control the discharge amount of the etching solutions 530a and 630a or the electrode solutions 550a and 650a in a femtoliter unit. Further, since the etching solutions 530a and 630a and the electrode solutions 550a and 650a can be accurately discharged at desired locations, short circuit of the devices can be prevented.

Further, according to the method for fabricating a thin film transistor substrate 100 according to an embodiment of the present invention, the discharge of the etching solutions 530a and 630a and the discharge of the electrode solutions 550a and 650a are successively performed using the single discharge devices 500 and 600, the process optimization can be sought.

Figure 13:
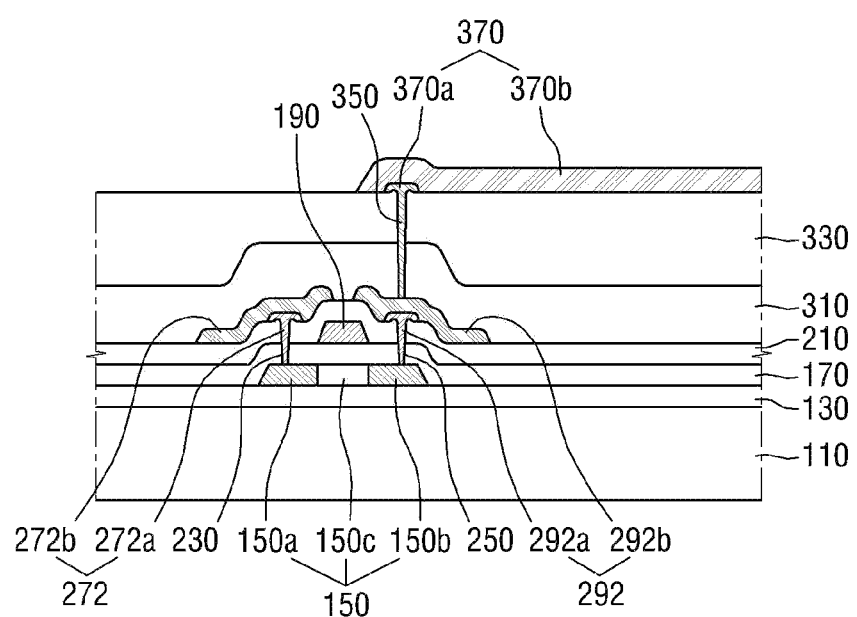
FIG. 13 is a cross-sectional view illustrating a thin film transistor substrate according to another embodiment of the present invention.

Hereinafter, a thin film transistor substrate 102 according to another embodiment of the present invention will be described with reference to FIG. 13. FIG. 13 is a cross-sectional view illustrating a thin film transistor substrate 102 according to another embodiment of the present invention. For convenience in explanation, the same reference numerals are used for elements that are substantially the same as the respective elements illustrated in FIG. 1, and the duplicate description thereof will be omitted.

According to the thin film transistor substrate 102 according to another embodiment of the present invention, a source electrode 272 and a drain electrode 292 may be formed as a double layer in the same manner as the pixel electrode 370 as described above.

Specifically, the source electrode 272 may include a first source electrode 272a located inside the source contact hole 230 and a second source electrode 272b located on the source contact hole 230. In an exemplary embodiment, after the first source electrode 272a is formed inside the source contact hole 230 in the electrohydrodynamic ink jet process, the second source electrode 272b may be formed through deposition of an electrode material on the source contact hole 230. Here, the composition and/or the properties of the first source electrode 272a and the second source electrode 272b may differ from each other. Specifically, the composition and/or the properties of the first source electrode 272a may correspond to the composition and/or the properties of the first pixel electrode 370a as described above, and the composition and/or the properties of the second source electrode 272b may correspond to the composition and/or the properties of the second pixel electrode 370b as described above.

The drain electrode 292 may include a first drain electrode 292a located inside the drain contact hole 250 and a second drain electrode 292b located on the drain contact hole 250. In an exemplary embodiment, after the first drain electrode 292a is formed inside the drain contact hole 250 in the electrohydrodynamic ink jet process, the second drain electrode 292b may be formed through deposition of an electrode material on the drain contact hole 250. Here, the composition and/or the properties of the first drain electrode 292a and the second drain electrode 292b may differ from each other. Specifically, the composition and/or the properties of the first drain electrode 292a may correspond to the composition and/or the properties of the first pixel electrode 370a as described above, and the composition and/or the properties of the second drain electrode 292b may correspond to the composition and/or the properties of the second pixel electrode 370b as described above.

Figure 14:
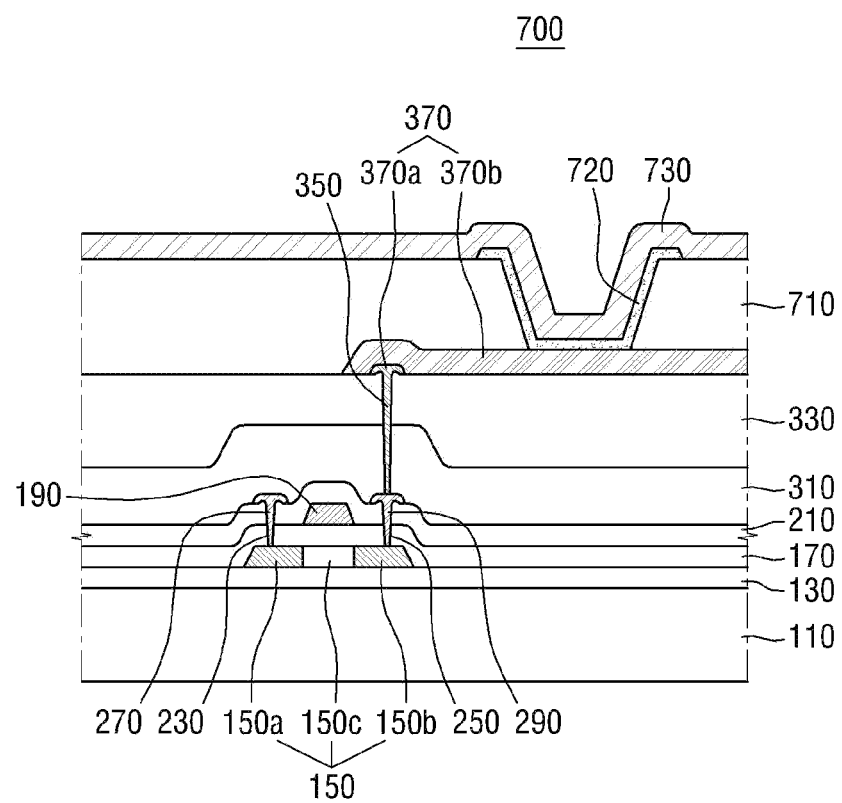
FIG. 14 is a cross-sectional view illustrating a display device according to an embodiment of the present invention.

Hereinafter, a display device according to an embodiment of the present invention will be described with reference to FIG. 14. FIG. 14 is a cross-sectional view illustrating a display device according to an embodiment of the present invention. For convenience in explanation, the same reference numerals are used for elements that are substantially the same as the respective elements illustrated in FIG. 1, and the duplicate description thereof will be omitted.

The display device according to an embodiment of the present invention may be an organic light emitting display 700. In an exemplary embodiment, the organic light emitting display 700 may include the thin film transistor substrate 100 of FIG. 1, a pixel-defining film 710 formed on the pixel electrode 370 of the thin film transistor substrate 100 and including an opening, an organic light emitting layer 720 located in the opening, and a common electrode 730 facing the pixel electrode 370.

The organic light emitting layer 720 is formed between the pixel electrode 370 and the common electrode 730. If current is applied to the organic light emitting layer 720, electrons and holes in the organic light emitting layer 720 are recombined to form excitons, and light of a specific wavelength is generated by energy from the excitons.

On the other hand, the organic light emitting layer 720 may be made of a low molecular organic material and a high molecular organic material. The organic light emitting layer 720 may include a hole injection layer (HIL), a hole transporting layer (HTL), a hole blocking layer (HBL), an electron transporting layer (ETL), an electron injection layer (EIL), and an electron blocking layer (EBL).

Figure 15:
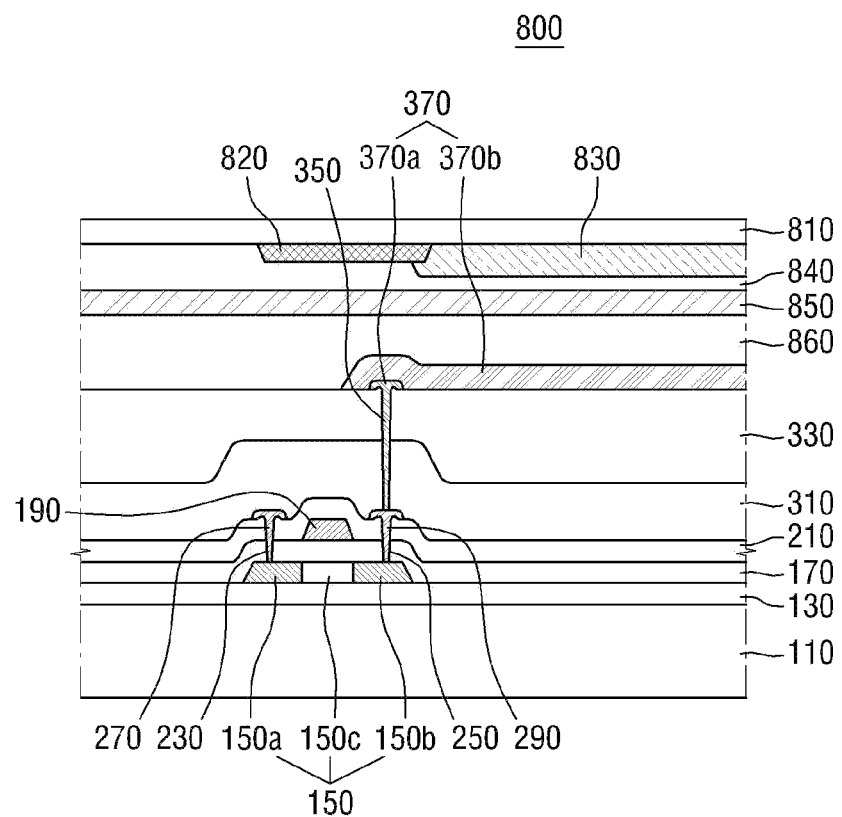
FIG. 15 is a cross-sectional view illustrating a display device according to another embodiment of the present invention.

Hereinafter, a display device according to another embodiment of the present invention will be described with reference to FIG. 15. FIG. 15 is a cross-sectional view illustrating a display device according to another embodiment of the present invention. For convenience in explanation, the same reference numerals are used for elements that are substantially the same as the respective elements illustrated in FIG. 1, and the duplicate description thereof will be omitted.

The display device according to another embodiment of the present invention may be a liquid crystal display 800. In an exemplary embodiment, the liquid crystal display 800 may include the thin film transistor substrate 100 of FIG. 1, an opposed substrate, and a liquid crystal layer 860. The opposed substrate may include an insulating substrate 810, a black matrix 820 for light leakage prevention, a color filter 830 for color representation, an overcoat layer 840 for mitigating the step height between the black matrix 820 and the color filter 830, and a common electrode 850 formed on the overcoat layer 840. The opposed substrate may be opposed to the thin film transistor substrate 100. Further, a liquid crystal layer 860 is interposed between the thin film transistor substrate 100 and the opposed substrate. The liquid crystal layer 860 adjusts the light transmissivity of light that is emitted from a backlight (not illustrated) due to the voltage difference between the pixel electrode 370 and the common electrode 850.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A thin film transistor substrate, comprising:
a substrate;
a semiconductor layer disposed on the substrate;
a gate insulating film disposed on the semiconductor layer;
a gate electrode disposed on the gate insulating film;
an interlayer insulating film disposed on the gate electrode and including a source contact hole and a drain contact hole for exposing portions of the semiconductor layer;
a source electrode and a drain electrode respectively inserted into the source contact hole and the drain contact hole;
a planarization layer disposed on the source electrode and the drain electrode, the planarization layer including a pixel contact hole exposing a portion of the drain electrode, with the semiconductor layer, the drain contact hole and the pixel contact hole overlapping each other; and
a pixel electrode inserted into the pixel contact hole,
the interlayer insulating film including a first convex portion formed at an inlet of the source contact hole and at an inlet of the drain contact hole.

2. The thin film transistor substrate of claim 1,
the planarization layer including a second convex portion formed at an inlet of the pixel contact hole.

3. The thin film transistor substrate of claim 1, wherein the pixel electrode comprises:
a first pixel electrode formed inside the pixel contact hole; and
a second pixel electrode formed on the planarization layer and over the first pixel electrode.

4. A thin film transistor substrate comprising:
a substrate;
a semiconductor layer disposed on the substrate;
a gate insulating film disposed on the semiconductor layer;
a gate electrode disposed on the gate insulating film;
an interlayer insulating film disposed on the gate electrode and including a source contact hole and a drain contact hole for exposing portion of the semiconductor layer;
a source electrode and a drain electrode respectively inserted into the source contact hole and the drain contact hole; and
a first pixel electrode and a second pixel electrode disposed on the drain electrode, the first pixel electrode and the second pixel electrode being made of different materials.

5. The thin film transistor substrate of claim 1, wherein the source electrode comprises:
a first source electrode formed inside the source contact hole; and
a second source electrode formed on the source contact hole.

6. A thin film transistor substrate comprising:
a substrate;
a semiconductor layer disposed on the substrate;
a gate insulating film disposed on the semiconductor layer;
a gate electrode disposed on the gate insulating film;
an interlayer insulating film disposed on the gate electrode and including a source contact hole and a drain contact hole for exposing portion of the semiconductor layer; and
a source electrode and a drain electrode respectively inserted into the source contact hole and the drain contact hole;
wherein the source electrode comprises a first source electrode disposed inside the source contact hole and a second source electrode disposed on the interlayer insulating film and the first source electrode, the first source electrode and the second source electrode being made of different materials.

7. The thin film transistor substrate of claim 1, wherein the drain electrode comprises:
a first drain electrode formed inside the drain contact hole; and
a second drain electrode formed on the drain contact hole.

8. A thin film transistor substrate comprising:
a substrate;
a semiconductor layer disposed on the substrate;
a gate insulating film disposed on the semiconductor layer;
a gate electrode disposed on the gate insulating film;
an interlayer insulating film disposed on the gate electrode and including a source contact hole and a drain contact hole for exposing portion of the semiconductor layer; and
a source electrode and a drain electrode respectively inserted into the source contact hole and the drain contact hole;
wherein the drain electrode comprises a first drain electrode disposed inside the drain contact hole and a second drain electrode disposed on the interlayer insulating film and the first drain electrode, the first drain electrode and the second drain electrode being made of different materials.

9. A method for fabricating a thin film transistor, the method comprising:
forming a semiconductor layer on a substrate;
forming a preliminary gate insulating film on the semiconductor layer;
forming a gate electrode on the preliminary gate insulating film;
forming a preliminary interlayer insulating film on the gate electrode;
respectively converting the preliminary gate insulating film and the preliminary interlayer insulating film into a gate insulating film and an interlayer insulating film, by forming a source contact hole and a drain contact hole for exposing portions of the semiconductor layer and by forming a first convex portion at an inlet of the source contact hole and at an inlet of the drain contact hole through discharging a first etching solution onto the preliminary interlayer insulating film; and
respectively forming a source electrode and a drain electrode in the source contact hole and the drain contact hole,
wherein the forming the source electrode and the drain electrode comprises electrohydrodynamically discharging a jet of the first electrode solution onto the source contact hole and the drain contact hole and sintering the discharged first electrode solution.

10. The method for fabricating a thin film transistor of claim 9, wherein the first etching solution is discharged in an electrohydrodynamic ink jet process.

11. The method for fabricating a thin film transistor of claim 9, wherein the discharging of the first etching solution and the discharging of the first electrode solution are successively performed by a first discharge device.

12. The method for fabricating a thin film transistor of claim 9, wherein the forming of the source electrode and the drain electrode comprises depositing an electrode material on the source contact hole and the drain contact hole after the sintering of the discharged first electrode solution.

13. The method for fabricating a thin film transistor of claim 9, further comprising:
   forming a preliminary planarization layer on the source electrode and the drain electrode;
   converting the preliminary planarization layer into a planarization layer by forming a pixel contact hole for exposing a portion of the drain electrode by discharging of a second etching solution onto the preliminary planarization layer; and
   forming a pixel electrode in the pixel contact hole.

14. The method for fabricating a thin film transistor of claim 13, wherein the second etching solution is electrohydrodynamically discharged as a jet of the second etching solution.

15. A method for fabricating a thin film transistor, the method comprising:
   forming a semiconductor layer on a substrate;
   forming a preliminary gate insulating film on the semiconductor layer;
   forming a gate electrode on the preliminary gate insulating film;
   forming a preliminary interlayer insulating film on the gate electrode;
   forming a preliminary planarization layer on the source electrode and the drain electrode;
   converting the preliminary planarization layer into a planarization layer by forming a pixel contact hole for exposing a portion of the drain electrode by discharging of a second etching solution onto the preliminary planarization layer; and
   forming a pixel electrode in the pixel contact hole, wherein the forming the pixel electrode comprises:
      electrohydrodynamically discharging a jet of the second electrode solution onto the pixel contact hole; and
      sintering the discharged second electrode solution.

16. The method for fabricating a thin film transistor of claim 15, wherein the discharging of the second etching solution and the discharging of the second electrode solution are successively performed by a second discharge device.

17. The method for fabricating a thin film transistor of claim 15, wherein the forming of the pixel electrode comprises depositing an electrode material on the pixel contact hole after the sintering of the discharged second electrode solution.

18. A display device, comprising:
   a thin film transistor substrate, including:
   a substrate;
   a semiconductor layer disposed on the substrate;
   a gate insulating film disposed on the semiconductor layer;
   a gate electrode disposed on the gate insulating film;
   an interlayer insulating film disposed on the gate electrode and having a source contact hole and a drain contact hole for exposing portions of the semiconductor layer;
   a source electrode and a drain electrode respectively inserted into the source contact hole and the drain contact hole;
   a planarization layer disposed on the source electrode and the drain electrode and having a pixel contact hole for exposing a portion of the drain electrode;
   and
   a pixel electrode inserted into the pixel contact hole;
   a common electrode facing the pixel electrode; and
   an organic light emitting layer or a liquid crystal layer disposed between the pixel electrode and the common electrode,
   the interlayer insulating film and the planarization layer including convex portions formed at an inlet of the source contact hole, an inlet of the drain contact hole, and an inlet of the pixel contact hole,
   wherein the semiconductor layer, the drain contact hole and the pixel contact hole overlap each other.

* * * * *